US006926425B2

United States Patent
Hsu

(10) Patent No.: US 6,926,425 B2
(45) Date of Patent: Aug. 9, 2005

(54) METHOD AND ARRANGEMENT FOR AFFIXING LED ON CIRCUIT BOARD WITH LIGHTING AT BOTH SIDES THEREOF

(76) Inventor: Allen Yen Chung Hsu, 2 Del Italia, Irvine, CA (US) 92614

( * ) Notice: Subject to any disclaimer, the term of this patent is extended or adjusted under 35 U.S.C. 154(b) by 129 days.

(21) Appl. No.: 10/442,563

(22) Filed: May 22, 2003

(65) Prior Publication Data

US 2004/0233667 A1 Nov. 25, 2004

(51) Int. Cl.[7] .............................................. F21V 21/00
(52) U.S. Cl. ........................ 362/240; 362/249; 362/252; 362/800
(58) Field of Search ................................. 362/249, 252, 362/800, 812, 237, 240; 40/124.02, 541

(56) References Cited

U.S. PATENT DOCUMENTS

| 4,709,307 | A | * | 11/1987 | Branom ........................ 362/103 |
| 5,890,794 | A | * | 4/1999 | Abtahi et al. ................. 362/294 |
| 5,950,340 | A | * | 9/1999 | Woo ............................. 40/564 |
| 6,158,882 | A | * | 12/2000 | Bischoff, Jr. ................. 362/488 |
| 6,616,313 | B2 | * | 9/2003 | Furst et al. .................. 362/494 |
| 2004/0037079 | A1 | * | 2/2004 | Luk ............................ 362/252 |

* cited by examiner

*Primary Examiner*—Thomas M. Sember
(74) *Attorney, Agent, or Firm*—Raymond Y. Chan; David and Raymond

(57) ABSTRACT

A LED-circuit board affixing arrangement includes a circuit board and a LED affixed thereon. The circuit board has a first side, an opposed second side having a circuitry provide thereon, and a positioning hole formed on the circuit board. The LED includes an illuminating body having a head portion and a tail portion, and two legs extended therefrom to electrically connect to the circuitry, wherein the illuminating body is inserted into the positioning hole to hold the illuminating body on the board body at a position that the head portion is protruded from the first side of the circuit board and the tail portion is protruded from the second side of the circuit board. Therefore, the illuminating body of the LED is capable for producing lights throughout the head and tail portions thereof to provide a consequent light effect at the first and second sides of the circuit board.

21 Claims, 3 Drawing Sheets

METHOD AND ARRANGEMENT FOR AFFIXING LED ON CIRCUIT BOARD WITH LIGHTING AT BOTH SIDES THEREOF

BACKGROUND OF THE PRESENT INVENTION

1. Field of Invention

The present invention relates to a Light Emitting Diode (LED) affixing arrangement, and more particularly to a method and arrangement for affixing a LED on a circuit board to provide a light effect on both front and rear sides of the circuit board so as to simplify the electrical and structural configuration of the circuit board incorporating with the LED.

2. Description of Related Arts

Nowadays, most decoration lighting and advertisement signs are fluorescent or neon lamps. The fluorescent lamp or the neon lamp not only gives the sharp and colored image of the advertisement sign but also provides lots of fancy for decoration. Therefore, the sign of the street number or the indication sign such as the "OPEN" sign at the entrance of the restaurant is made by the fluorescent lamp or the neon lamp.

In addition, the significant feature of such fluorescent/neon lamp is that the light effect is provided at the front side and the rear side of the signboard in such a manner that the light effect of the fluorescent/neon lamp can be seen from the front and rear sides thereof, so as to enhance the decorative purpose of the fluorescent/neon lamp.

However, such fluorescent/neon lamp has several drawbacks. The frame size of the sign must be large enough to fit the fluorescent/neon lamp having a relatively large size. In other words, the fluorescent/neon lamp cannot incorporate with a smaller frame size of the sign. In addition, each word sign formed by the fluorescent/neon tube must be custom made. Thus, since the arrays of the alphabet and/or the number of the word signs are linked with each other, when one of the alphabet or the number is broken, which is not replaceable, the fluorescent/neon lamp must be replaced.

Since a Light Emitting Diode (LED) is inexpensive and has a smaller size in comparison with the fluorescent/neon tube, most of the decoration lighting and advertisement signs are incorporated with the LED. Furthermore, the distinct features of the LED are that not only the LED requires less electricity for operation and simple installation, but also the brightness of the LED is better than the fluorescent/neon lamp.

The conventional electrical connection for the LED is that the LED is mounted on a circuit board having a circuitry printed thereon, wherein two legs of the LED are welded on the circuit board to electrically connect with the circuitry. Accordingly, the circuitry is printed on the front side of the circuit board in such a manner that when the LED is electrically connected to the circuitry, the LED can only provide a light effect at the front side of the circuit board. In order to obtain an additional light effect at the rear side of the circuit board, an additional circuitry must be printed on the rear side of the circuit board to electrically connect with an additional LED. In other words, two circuitries and two LED must be provided at the front and rear sides of the circuit board respectively for providing the light effects at two sides of the circuit board, so as to highly complicate the manufacturing process of the decoration lighting and advertisement signs.

Moreover, the legs of the LED are relatively weak such that when an external force is exerted on the LED, the legs thereof will be broken so as to electrically disconnect the LED with the circuitry. Therefore, the conventional attachment between the LED and the circuit board cannot provide a rigid construction to support the LED on the circuit board. However, the signs are generally located at the outdoors such that the LED will be accidentally damaged at such outdoor environment.

In addition, it is illogical that the light effect from the front side of the circuit is different from that of the rear side thereof to obtain different indications of the sign. Therefore, the two circuitries must be identically printed on the front and rear sides of the circuit board respectively to provide a corresponding light effect at both sides of the circuit board, so as to complicate the electric configuration of the circuit board and to increase the manufacturing cost of the decoration lighting and advertisement signs.

SUMMARY OF THE PRESENT INVENTION

A main object of the present invention is to provide an arrangement for affixing a LED on a circuit board to provide a light effect on both first and second sides of the circuit board.

Another object of the present invention is to provide an arrangement for affixing a LED on a circuit board, wherein only one LED is required to provide a light effect at the first and second sides of the circuit board, so as to minimize the manufacturing cost of the circuit board incorporating with the LED.

Another object of the present invention is to provide an arrangement for affixing a LED on a circuit board, wherein only one circuitry is required to be printed on the first side of the circuit board to electrically connect with the LED in order to provide the double-sided light effect. In other words, the light effect of the LED is consequently provided at the first and second sides of the circuit board, so as to simplify the electrical configuration of the circuit board.

Another object of the present invention is to provide an arrangement for affixing a LED on a circuit board, wherein the circuit board has two retaining holes formed thereon not only for securely mounting the legs of the LED respectively but also for electrically connecting with the circuitry, so as to ensure the substantial attachment between the LED and the circuit board.

Another object of the present invention is to provide a method of affixing a LED on a circuit board, wherein the affixing process of the LED is quick and simply that by inserting the LED into a positioning hole formed on the circuit board and inserting the legs of the LED into the retaining holes to electrically connect with the circuitry printed on the circuit board.

Another object of the present invention is to provide an arrangement for affixing a LED on a circuit board, wherein no complicated or expensive electrical structure is required to achieve the above mentioned objects of the present invention. Therefore, the present invention provides an economic and efficient solution for affixing the LED on the circuit board.

Accordingly, in order to accomplish the above objects, the present invention provides a LED-circuit board affixing arrangement, comprising:

a circuit board comprising a board body having a first side, an opposed second side, and at least a positioning hole formed thereon to communicate the first side with the second side, and a circuitry provided on the second side of the board body;

a LED comprising an illuminating body having a head portion and a tail portion, and two legs extended from the tail portion of the illuminating body to electrically connect to the circuitry, wherein the illuminating body is fittingly inserted into the positioning hole so as to hold the illuminating body on the board body at a position that the head portion of the illuminating body is protruded from the first side of the circuit board and the tail portion of the illuminating body is protruded from the second side of the circuit board; and a power source unit electrically connected to the circuitry in such a manner that the illuminating body of the LED is capable for producing lights throughout the head and tail portions thereof so as to provide a consequent light effect at the first and second sides of the circuit board.

The present invention further comprises a method of affixing the LED on the circuit board having a first side and an opposed second side, comprising the steps of:

(a) providing a positioning hole on the circuit board;

(b) fittingly inserting the illuminating body of the LED into the position hole to hold the LED on the circuit board so as to define a head portion of the illuminating body protruding from the first side of the circuit board and a tail portion of the illuminating body protruding from the second side of the circuit board; and (c) electrically connecting two legs of the LED to a circuitry provided on the second side of the circuit board in such a manner that the illuminating body of the LED is capable for producing lights throughout the head and tail portions thereof so as to provide a consequent light effect at the first and second sides of the circuit board.

These and other objectives, features, and advantages of the present invention will become apparent from the following detailed description, the accompanying drawings, and the appended claims.

DETAILED DESCRIPTION OF THE PREFERRED EMBODIMENT

Figure 1:
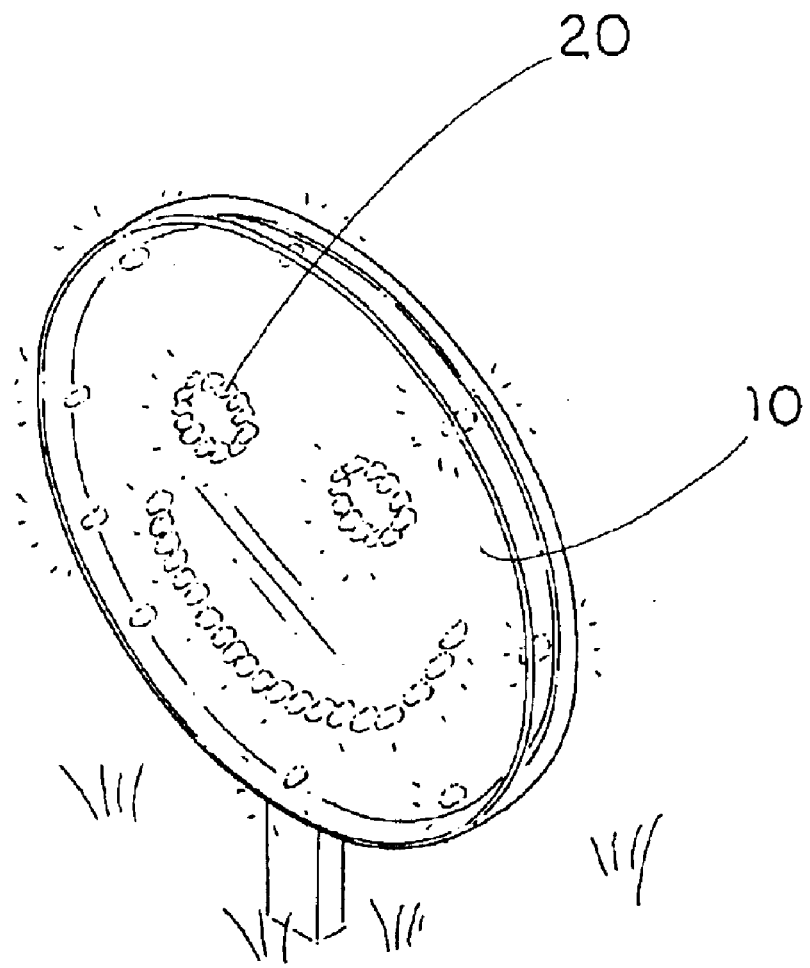
FIG. 1 is a perspective view of a signboard incorporated with a LED-circuit board affixing arrangement according to a preferred embodiment of the present invention.
Figure 2:
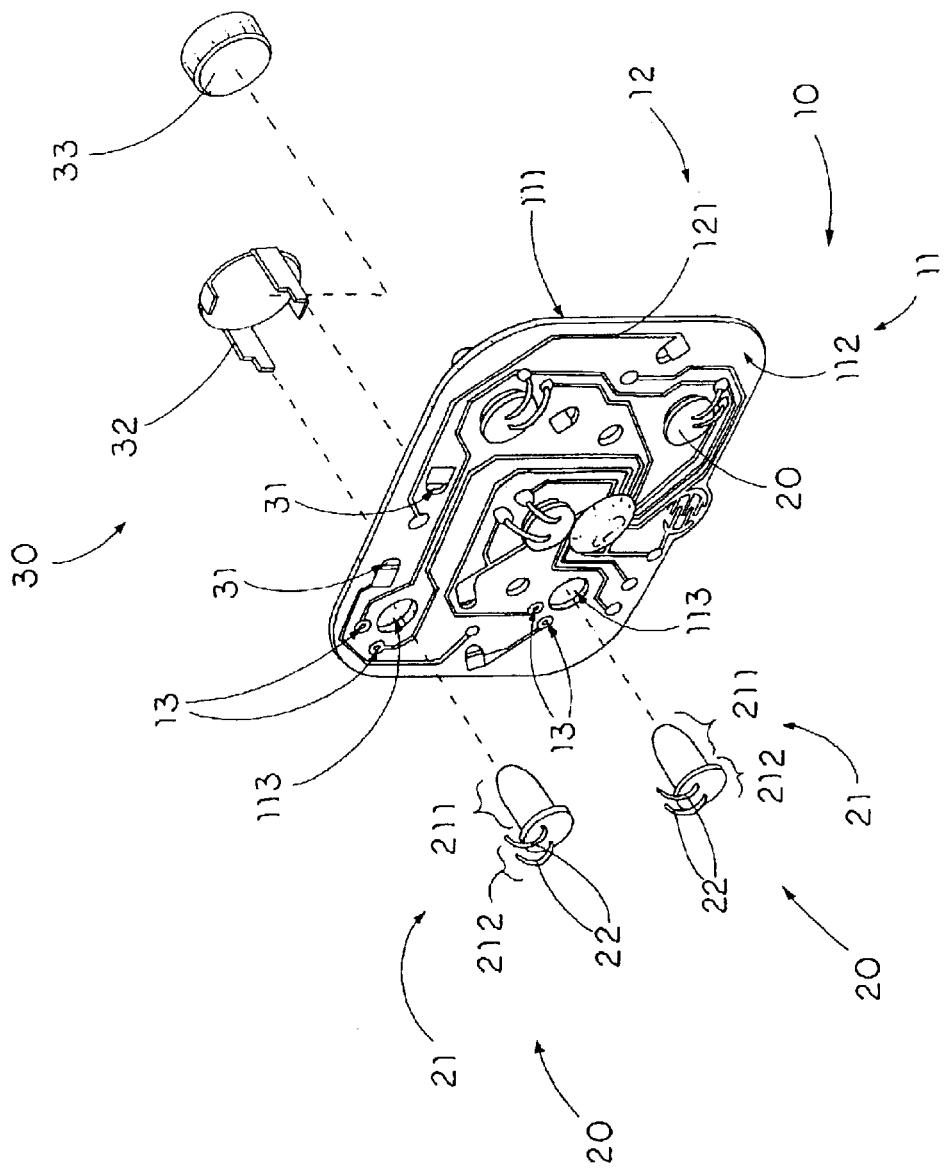
FIG. 2 is an exploded perspective view of the LED-circuit board affixing arrangement according to the above preferred embodiment of the present invention.
Figure 3:
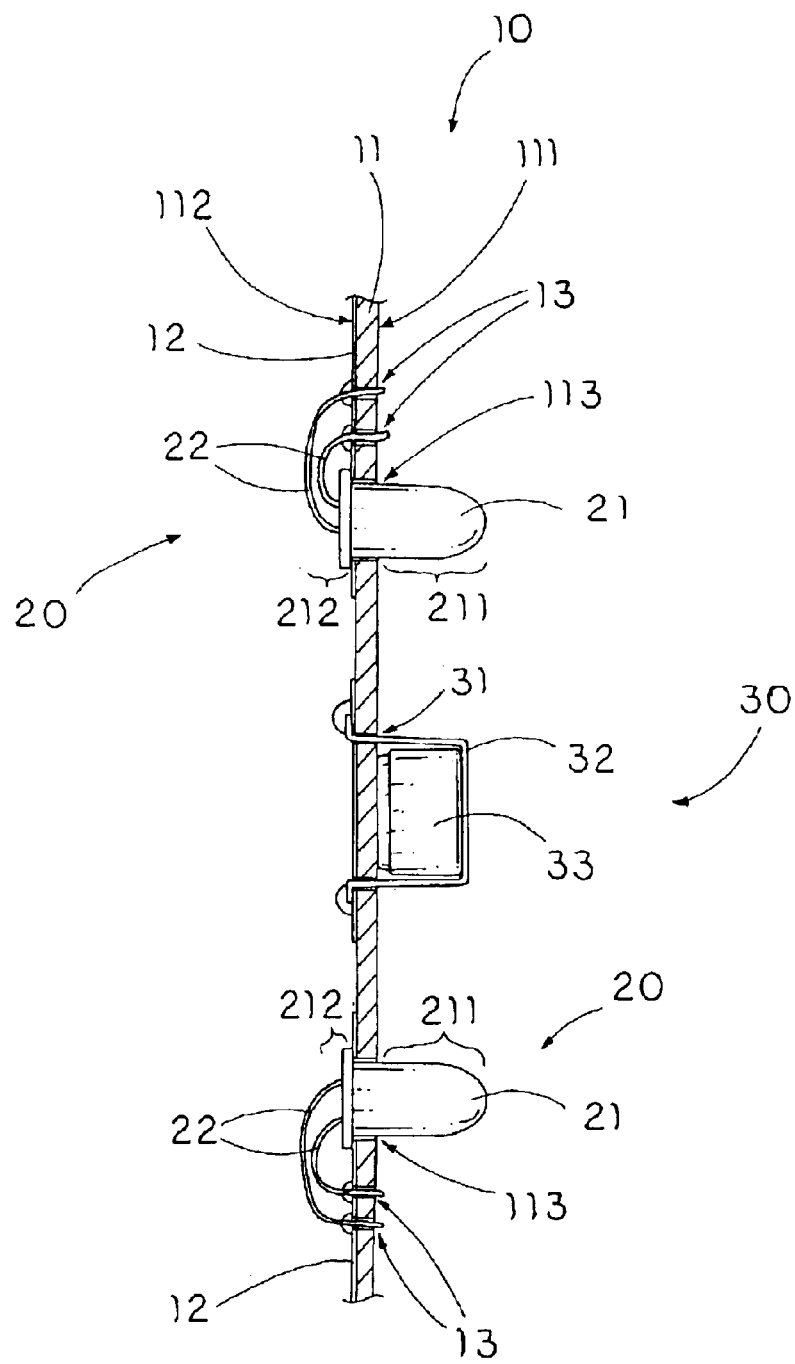
FIG. 3 is a sectional view of the LED-circuit board affixing arrangement according to the above preferred embodiment of the present invention.

Referring to FIGS. 1 to 3, a LED-circuit board affixing arrangement according to a preferred embodiment of the present invention is illustrated, wherein the LED-circuit board affixing arrangement comprises a circuit board 10, a LED 20, and a power source unit 30.

The circuit board 10 comprises a board body 11 having a first side 111, an opposed second side 112, and at least a positioning hole 113 formed thereon to communicate the first side 111 with the second side 112, and a circuitry 12 provided on the second side 112 of the board body 11.

The LED 20 comprises an illuminating body 21 having a head portion 211 and a tail portion 212, and two legs 22 extended from the tail portion 212 of the illuminating body 21 to electrically connect to the circuitry 12, wherein the illuminating body 21 is fittingly inserted into the positioning hole 113 so as to hold the illuminating body 21 on the board body 11 at a position that the head portion 211 of the illuminating body 21 is protruded from the first side 111 of the circuit board 10 and the tail portion 212 of the illuminating body 21 is protruded from the second side 112 of the circuit board 10.

The power source unit 30 is electrically connected to the circuitry 12 in such a manner that the illuminating body 21 of the LED 20 is capable for producing lights throughout the head and tail portions 211, 212 thereof so as to provide a consequent light effect at the first and second sides 111, 112 of the circuit board 10.

According to the preferred embodiment, the first and second sides 111, 112 of the board body 11 are embodied as front and rear sides of the board body 11 respectively wherein the board body 11, such as a conventional board body of the circuit board, is made of rigid but light weight material, such as glass-epoxy base material.

The circuitry 12 comprises an electric pathway 121 having a predetermined patterned provided on the second side 112 of the board body 11 by printing the electric pathway 121 thereon so as to form the circuit board 10 with a predetermined electrical configuration.

As shown in FIG. 2, the positioning hole 113 is a through hole formed on the board body 11 wherein the positioning hole 113 is formed on the circuit board 10 at a position apart from the circuiting path 121 so as to prevent the circuiting path 121 from being broken by the positioning hole 113. The positioning hole 113 is shaped and sized to fit the head portion 211 of the illuminating body 21 of the LED inserting thereinto.

The LED 20, such as a conventional LED, is adapted for providing the light effect wherein the illuminating body 21 is embodied to have a LED die received in a lens. As shown in FIG. 2, the head portion 211 of the illuminating body 21 has a size slightly smaller than the tail portion 212 of the illuminating body 21, wherein the head portion 211 of the illuminating body 21 is defined at a portion protruded from the first side 111 of the board body 11 and the tail portion 212 of the illuminating body 21 is defined at a portion thereof protruded from the second side 112 of the board body 11 when the illuminating unit 21 is inserted into the positioning hole 113 of the board body 11, as shown in FIG. 3.

The legs 22 of the LED 20 are embodied as an anode and cathode of the LED coupled to the LED die, wherein the legs 22 are extended from the tail portion 212 of the illuminating body 21 to electrically connect to the electric pathway 121 of the circuitry 12, as shown in FIG. 3.

The circuit board 10 further has two spaced apart retaining holes 13 formed on the board body 11 at a position adjacent to the positioning hole 113 wherein the legs 22 of the LED 20 are fittingly inserted into the retaining holes 13 respectively so as to securely mount the LED 20 on the circuit board 10.

As shown in FIG. 2, the two retaining holes 13 are formed along the electric pathway 121 of the circuitry 12 in such a manner that when the legs 22 of the LED 20 are inserted into the retaining holes 13, the LED 20 is electrically connected with the circuitry 12. In other words, the retaining holes 13 not only provide a secure arrangement to hold the LED 20 on the board body 11 when the legs 22 of the LED 20 are respectively inserted into the retaining holes 13 but also provide an electrical connection between the LED 20 and the circuit board 10, so as to simplify the electrical and structural configuration of the present invention.

The power source unit 30 has at least a though hole 31 formed on the board body 11 and comprises a power source holder 32 mounted on the board body 11 through the through hole 31 for receiving a replaceable battery 33, so as to electrically connect to the LED 20 through the circuitry 12. Accordingly, the through hole 31 is formed along the electric pathway 121 of the circuit 12 in such a manner that the power source holder 32 is electrically contacted with the electric pathway 121 of the circuit 12 to electrically connect the replaceable battery 33 to the circuitry 20.

According to the preferred embodiment, the present invention further comprises a method for affixing the LED 20 on the circuit board 10, which comprises the steps as follows.

(1) Provide the positioning hole 113 on the circuit board 10.

(2) Fittingly insert the illuminating body 21 of the LED 20 into the position hole 113 to hold the LED 20 on the circuit board 10 so as to define the head portion 211 of the illuminating body 21 protruding from the first side 111 of the circuit board 10 and the tail portion 212 of the illuminating body 21 protruding from the second side 112 of the circuit board 10.

(3) Electrically connect the two legs 22 of the LED 20 to the circuitry 12 provided on the second side 112 of the circuit board 10 in such a manner that the illuminating body 21 of the LED 20 is capable for producing lights throughout the head and tail portions 211, 212 thereof so as to provide a consequent light effect at the first and second sides 111, 112 of the circuit board 10.

Before the step (1), the electric pathway 121 of the circuitry 12 is printed on the board body 11 of the circuit board 10 in such a manner the positioning hole 113 is formed on the board body 11 at a position apart from the electric pathway 121 of the circuitry 12. In addition, the retaining holes 13 are formed on the board body 11 at a position on the electric pathway 121 adjacent to the positioning hole 112.

In step (2), the illuminating body 21 of the LED 20 is inserted into the positioning hole 113 until the head portion 211 of the illuminating body 21 is protruded from the first side 111 of the board body 11 and the tail portion 212 of the illuminating body 21 is protruded from the second side 112 of the board body 11 in such a manner that the illuminating body 21 is securely held on the board body 11.

The step (3) further comprises the steps of:

(3.1) inserting the legs 22 of the LED 20 into the retaining holes 13 respectively; and (3.2) soldering the legs 22 of the LED 20 on the board body 11 of the circuit board 10 so as to electrically connect the LED with the circuitry 12 thereof.

In step (3.1), the legs 22 of the LED 20 are bent to insert into the retaining holes 13 respectively to further securely retain the illuminating body 21 of the LED 20 on the circuit board 10 within the positioning hole 113. Accordingly, due to the bending structure of the legs 22 of the LED 20, the legs 22 provide an urging pressure against the illuminating body 21 within the positioning holes 113 so as to substantially retain the illuminating body 21 on the circuit board 20.

In step (3.2), since the retaining holes 13 are spacedly formed along the electric pathway 121 of the circuitry 12, the legs 22 of the LED 20 are capable of securely mounting on the board body 11 through the retaining holes 13 so as to electrically connect to the circuitry 12 by soldering the legs 22 on the board body 11.

According to the preferred embodiment, the affixing arrangement of the present invention requires one LED 20 electrically connected to one circuitry 20 to provide the light effect at the first and second sides 111, 112 of the circuit board 10. In comparison with the conventional circuit board that two circuitries are respectively printed on two sides of the circuit board to electrically connect to two LEDs to provide the light effect at two sides of the circuit boards, the present invention not only simplifies the structural configuration by providing the positioning hole 113 on the circuit board 10 but also minimizes the circuitry 20 required to print thereon. The present invention provides better affixing arrangement between the LED and the circuit board 10 by the bending structure of the legs 22 to respectively insert into the retaining holes 13 in comparison with the conventional affixing structure of the LED on the circuit board. In addition, the light effects at the first and second sides 111, 112 of the circuit board 10 are consequent since the light effects are produced by the same LED 20.

One skilled in the art will understand that the embodiment of the present invention as shown in the drawings and described above is exemplary only and not intended to be limiting.

It will thus be seen that the objects of the present invention have been fully and effectively accomplished. It embodiments have been shown and described for the purposes of illustrating the functional and structural principles of the present invention and is subject to change without departure form such principles. Therefore, this invention includes all modifications encompassed within the spirit and scope of the following claims.

What is claimed is:

1. A LED-circuit board affixing arrangement, comprising:
a circuit board comprising a board body having a first side, an opposed second side, and at least a positioning hole formed thereon to communicate said first side with the second side, and a circuitry provided on said second side of said board body;
a LED comprising a lens-liked illuminating body having a head portion and a tail portion, and two legs extended from said tail portion of said illuminating body to electrically connect to said circuitry, wherein said illuminating body is fittingly inserted into said positioning hole so as to hold said illuminating body on said board body at a position that said head portion of said illuminating body is protruded from said first side of said circuit board and said tail portion of said illuminating body is protruded from said second side of said circuit board; and
a power source unit electrically connected to said circuitry in such a manner that said illuminating body of the LED is capable for producing lights throughout said head and tail portions thereof so as to provide a consequent light effect at said first and second sides of said circuit board.

2. The LED-circuit board affixing arrangement, as recited in claim 1, wherein said circuit board further has two retaining holes spacedly formed on said board body at a position adjacent to said positioning hole, wherein said legs of said LED are inserted into said retaining holes respectively so as to securely mount said LED on said circuit board.

3. The LED-circuit board affixing arrangement, as recited in claim 2, wherein said retaining holes are formed on said board body at a position along said circuitry such that when said legs of said LED are inserted into said retaining holes respectively, said LED are electrically connected to said circuitry.

4. The LED-circuit board affixing arrangement, as recited in claim 3, wherein said legs of said LED are bent to insert into said retaining holes respectively, so as to further securely retain said LED on said circuit board.

5. The LED-circuit board affixing arrangement, as recited in claim 4, wherein said positioning hole is a through hole formed on said board body at a position apart from said circuitry to hold said illuminating body of said LED in position.

6. The LED-circuit board affixing arrangement, as recited in claim 5, wherein said power source unit has at least a though hole formed on said board body and comprises a power source holder mounted on said board body through said through hole for receiving a replaceable battery, so as to electrically connect to said LED through said circuitry.

7. The LED-circuit board affixing arrangement, as recited in claim 6, wherein said through hole of said power source unit is formed on said board body at a position along said circuitry such that said power source holder is electrically contacted with said circuitry for electrically connecting said replaceable battery therewith.

8. The LED-circuit board affixing arrangement, as recited in claim 4, wherein said power source unit has at least a though hole formed on said board body and comprises a power source holder mounted on said board body through said through hole for receiving a replaceable battery, so as to electrically connect to said LED through said circuitry.

9. The LED-circuit board affixing arrangement, as recited in claim 8, wherein said through hole of said power source unit is formed on said board body at a position along said circuitry such that said power source holder is electrically contacted with said circuitry for electrically connecting said replaceable battery therewith.

10. The LED-circuit board affixing arrangement, as recited in claim 3, wherein said positioning hole is a through hole formed on said board body at a position apart from said circuitry to hold said illuminating body of said LED in position.

11. The LED-circuit board affixing arrangement, as recited in claim 2, wherein said legs of said LED are bent to insert into said retaining holes respectively, so as to further securely retain said LED on said circuit board.

12. The LED-circuit board affixing arrangement, as recited in claim 2, wherein said positioning hole is a through hole formed on said board body at a position apart from said circuitry to hold said illuminating body of said LED in position.

13. The LED-circuit board affixing arrangement, as recited in claim 1, wherein said power source unit has at least a though hole formed on said board body and comprises a power source holder mounted on said board body through said through hole for receiving a replaceable battery, so as to electrically connect to said LED through said circuitry.

14. The LED-circuit board affixing arrangement, as recited in claim 13, wherein said through hole of said power source unit is formed on said board body at a position along said circuitry such that said power source holder is electrically contacted with said circuitry for electrically connecting said replaceable battery therewith.

15. A method of affixing a LED on a circuit board, comprising the steps of:
(a) providing a positioning hole on said circuit board;
(b) fittingly inserting a lens-liked illuminating body of said LED into said position hole to hold said LED on said circuit board so as to define a head portion of said illuminating body protruding from a first side of said circuit board and a tail portion of said illuminating body protruding from an opposed second side of said circuit board; and
(c) electrically connecting two legs of said LED to a circuitry provided on said second side of said circuit board in such a manner that said illuminating body of said LED is capable for producing lights throughout said head and tail portions thereof so as to provide a consequent light effect at said first and second sides of said circuit board.

16. The method, as recited in claim 15, in step (c), further comprising the step of:
(c.1) respectively inserting said legs of said LED into two retaining holes spacedly formed on said circuit board at a position adjacent to said positioning hole; and
(c.2) soldering said legs of said LED on said circuit board so as to electrically connect said LED with said circuitry thereof.

17. The method, as recited in claim 16, wherein said retaining holes are formed on said circuit board at a position along said circuitry such that when said legs of said LED are inserted into said retaining holes respectively, said LED are electrically connected to said circuitry.

18. The method, as recited in claim 17, wherein, in step (c.1), said legs of said LED are bent to insert into said retaining holes respectively, so as to further securely retain said LED on said circuit board.

19. The method, as recited in claim 18, wherein said positioning hole is a through hole formed on said board body at a position apart from said circuitry to hold said illuminating body of said LED in position.

20. The method, as recited in claim 16, wherein, in step (c.1), said legs of said LED are bent to insert into said retaining holes respectively, so as to further securely retain said LED on said circuit board.

21. The method, as recited in claim 16, wherein said positioning hole is a through hole formed on said board body at a position apart from said circuitry to hold said illuminating body of said LED in position.

* * * * *